United States Patent [19]

Ryan et al.

[11] Patent Number: 4,495,380
[45] Date of Patent: Jan. 22, 1985

[54] COMBINED METAL AND PLASTIC STANDOFF

[75] Inventors: William P. Ryan, Bethany; Richard A. Mason, Orange; Vincent A. Maida, Cheshire; Timothy F. Donovan, Huntington, all of Conn.

[73] Assignee: Mite Corporation, New Haven, Conn.

[21] Appl. No.: 433,426

[22] Filed: Oct. 8, 1982

[51] Int. Cl.³ .................. F16B 19/00; H05K 7/12; H05K 7/14
[52] U.S. Cl. .................. 174/138 D; 24/453; 24/458; 361/412; 411/508
[58] Field of Search .......... 174/138 D, 158 R, 158 F, 174/164, 165, 166 R, 166 S, 177; 411/15, 360, 363, 508, 522, 900, 509, 510; 24/289, 293, 295–297, 305, 326, 335, 453, 458, 573, 618, 623, 625; 361/412; 403/408; 248/27.3, 73, 221.4, 239

[56] References Cited

U.S. PATENT DOCUMENTS

| Re. 24,488 | 6/1958 | Demurjian | 174/166 S |
|---|---|---|---|
| 2,218,431 | 10/1940 | McGee | 411/508 |
| 2,284,363 | 5/1942 | Boomsma | 174/166 S |
| 2,896,897 | 7/1959 | Schlueter | 248/239 |
| 3,777,052 | 12/1973 | Fegen | 1741/138 D |

FOREIGN PATENT DOCUMENTS

| 730065 | 5/1955 | United Kingdom | 174/158 F |
| 864036 | 3/1961 | United Kingdom | |

Primary Examiner—Laramie E. Askin
Attorney, Agent, or Firm—James & Franklin

[57] ABSTRACT

A combined metal and plastic standoff for supporting a circuit board in fixed spatial relationship with another element comprises a rigid plastic body of appreciable length to produce the standoff effect and a metal retaining member integrally mounted on the plastic body at an operative end thereof. The metal retaining member has main and retaining portions, the main portion being fixedly disposed within the plastic body and the retaining portion extending outwardly from the plastic body having a resilient reverse bend segment, and being adapted for engagement with the circuit board or other element by an essentially longitudinal motion of the standoff along the axis of the body length to physically secure the circuit board or other element to the plastic body adjacent to the operative end.

12 Claims, 7 Drawing Figures

COMBINED METAL AND PLASTIC STANDOFF

BACKGROUND OF THE INVENTION

The present invention relates to means for mounting components in electrical and electronic equipment and, more particularly, concerns a standoff for detachably securing chassis and circuit boards to one another.

Initially standoffs were formed of solid metal shafts which were internally bored and threaded at each end so that each end could be mounted to a chassis or circuit board structure by means of a screw going through the structure and into the internal bore of the standoff. The use of metal standoffs produced very secure attachments, but was not entirely satisfactory for a variety of reasons. Not only was the metal part expensive, but considerable labor was involved in threading the screw into the threaded bore of the metal shaft, this resulting in a slow and expensive assembly process. Furthermore, the standoffs could not be used in situations which did not permit access to the reverse surface of the structure so that the screw could be inserted and turned. Finally, the screws tended to become lost during the assembly process.

In the early 60's and 70's there came into use injection molded plastic standoffs—see, for example, U.S. Pat. No. 3,688,635, issued Sept. 5, 1972, and U.S. Pat. No. 3,777,052, issued Dec. 4, 1973—which were inexpensive (as no metal was used), were of one piece fabrication (so that there was no possibility of lost components), and were of a push-on pull-off design (so that the assembly process proceeded rapidly and without regard to whether or not there was access to the rear of the structure). Furthermore, the standoff could be made of an electrically insulative plastic, if desired, so that an electrically insulative connection resulted. The new plastic standoff was not without its disadvantages, however.

The push-on pull-off design of the retaining mechanisms relied essentially on camming actions resisted by friction or resiliency to prevent accidental separation. During shipment or jostling of an assembly constructed with the push-on pull-off plastic standoffs, however, the plastic standoffs tended to snap out just as easily as they had snapped in. Accordingly, it became common practice to include a locking mechanism which used a non-camming action to insure positive holding together of the assembly. Such locking mechanisms require, in addition to the normal movement of the assembly components away from each other, at least one additional action on the part of the person separating the components of the assembly. Typically, such locking mechanisms are of the snap-in type wherein a snap or holding member is deformed during the assembly process and then abruptly allowed to return to its original orientation. One could still simply push the stand-off into the structure, but in order to thereafter separate the standoff and structure, one had to not only pull the two elements apart, but also simultaneously deform the snap or holding member. Unfortunately, while this improvement removed the tendency of the plastic standoffs to snap out inadvertently, such plastic standoffs—whether with or without the lock or snap-in feature—tended to break at critical points of stress and, even when they did not actually break, the plastic tended to creep (that is, lose its resiliency) so that connections made therewith were unstable—i.e., they became loose over time, allowing both lateral and vertical movement of the structure relative to the standoff, if not initially, then over time.

Accordingly, the need remains for a standoff which combines the advantages of the metal standoff and the plastic standoff without the diadvantages of either.

It is an object of the present invention to provide a standoff approaching a combination of the strength and security of a metal standoff with the inexpensiveness and ease of assembly of a plastic standoff.

SUMMARY OF THE INVENTION

It has now been found that these and related objects of the present invention are obtained in a combined metal and plastic standoff. The standoff comprises a plastic body of appreciable length to produce the standoff effect and a metal retaining member integrally mounted on the body at an operative end thereof. For particular applications the plastic body preferably has two operative ends with at least one metal retaining member integrally mounted on the plastic body at each of the operative ends. Alternatively, the other end of the plastic body may be a solid of any desired shape (flat, rounded or curved) in order to provide an abutment surface. Finally, the other end may define a recess (either internally threaded to receive normal screws or unthreaded to receive self-tapping screws).

In a preferred embodiment, the standoff is adapted to retain an article intermediate its operative end and a part of the retaining member and further comprises a spring member mounted at the operative end and configured and dimensioned to hold the retained article against the retaining member.

The plastic body may be formed of an electrically insulative or conductive plastic, as desired for particular applications. The retaining member is preferably made from a single piece of resilient metal.

In a preferred embodiment, the retaining member comprises a main portion seated in and extending from the plastic body at an operative end thereof and a retaining portion spaced from the operative end, the portions of the retaining member being integrally connected together. Preferably the retaining portion is connected to the main portion by a reverse bend portion (preferably resilient), the portions of the retaining member being integrally connected together. It is especially preferred that the retaining member comprise a pair of retaining portions, each of the retaining portions being connected to an opposite end of the main portion by a reverse bend portion. A spring member may be mounted at the operative end and configured and dimensioned to hold the retained article against the retaining portion or portions.

The retaining portion is preferably a locking portion, typically of the snap-in type.

DETAILED DESCRIPTION OF THE PREFERRED EMBODIMENTS

Figure 1:
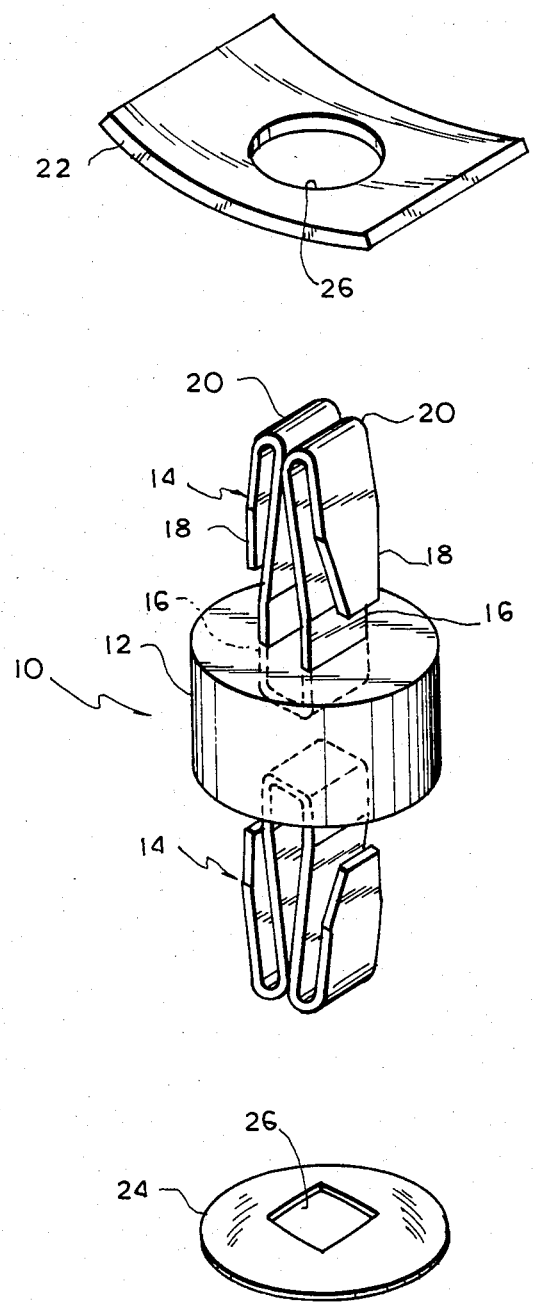
FIG. 1 is a partially exploded elevation view of the standoff of the present invention.

Referring now to FIG. 1 in particular, therein illustrated is a standoff generally designated by the numeral 10 and comprising a plastic body 12 of appreciable length to produce the standoff effect and metal snap-in locking members, generally designated by the numeral 14, mounted on the body 12 at either end.

The plastic body 12 is of generally cylindrical configuration, although other configurations may be utilized if desired. The cylinder is of appreciable length, the exact length being a function of the degree of standoff effect desired. The body may be molded from any of the common engineering plastics characterized by high strength, high rigidity and non-compressibility. Dependent upon the particular applications intended for the standoff, the plastics may also be selected for its non-corrosiveness, impact resistance and a general matching of the thermal coefficients of expansion of the plastic of the body 12 and the metal of the locking member 14. Preferred materials include nylon, polycarbonate, ABS, linear polyoxymethylene-type acetyl resins such as those sold under the trade name Delrin, and thermoplastic polyesters such as those sold by General Electric under the trade name Valox. Depending on whether the standoff is intended to be electrically conductive or insulative for a given application, the body will be formed accordingly of conductive or insulative plastic. If desired, the body may be of relatively narrow diameter and, to impart additional strength to the body, provided with axially extending ribs and/or with collars at either end.

The locking member 14 is comprised of a main portion 16 which is seated in and extends from the body 12 at one end thereof and a snap-in portion 18 remote from that body end and connected to the main portion 16 by a reverse bend portion 20. The various locking member portions 16, 18 and 20 are integrally connected together, with at least the reverse bend portion 20 being resilient. As illustrated, there are two snap-in portions 18, each being connected to an opposite end of the main portion 16 by a reverse bend portion 20. The locking member 14 is of uniform width except for the snap-in portion 18 which tapers slightly to a lesser width at its free end. The main portion 16 is of generally U-shaped configuration with the legs of the "U" coming together so that the reverse bend portions 20 are in contact and the snap-in portions 18 extend back towards the base of the "U" outwardly of the legs thereof. The snap-in portions 18 terminate remotely from the adjacent end of the plastic body 12, the exact spacing between the ends of the snap-in portions 18 and the proximate face of the body 12 being determined by the anticipated width of the structure to be secured at that end of the standoff. The entire locking member 14 is preferably made from a single piece of resilient metal, such as sheet metal stock. It is preferably made of a heat-treated metal such as beryllium copper, spring steel, stainless steel, or the like. For particular anti-corrosive applications, the metal should be selected for its non-corrosiveness.

The portion of the locking member main portion 16 which is seated in the plastic body 12 may be secured there by any of the fastening means well-known in the art. For example, the locking member 14 may be inserted into the body 12 using sonic insertion, or, where the body 12 is provided with a pre-formed recess, cementing, press fitting (for this technique the legs of the locking member main portion 16 may be provided with outwardly extending barbed tines), etc. If desired, the locking member main portion 16 may be externally threaded and an internally threaded recess provided in the plastic body 12, thereby to enable the locking member to be screwed into the plastic body. The exact method of securing the locking member to the plastic body is immaterial as long as a secure connection is achieved.

While not essential to the utility of the standoff of the present invention, preferably the standoff will be provided with one or more spring members mounted on the locking portions to provide the desired tight fit vertically. The members 22, 24 are formed of springy sheet metal stock, similar to the metal used in the locking member 14, and define a centrally disposed aperture 26 which enables them to be slipped over the locking member and be maintained between the snap-in portions 18 and the proximate faces of the plastic body 12. The precise size and configuration of the spring members will be determined by the intended application of the standoff, a larger spring member 22 generally being used at the end of the standoff designed for connection to the chassis and a relatively smaller spring member 24 generally being used at the end of the standoff designed for connection to a printed circuit board.

Figure 2:
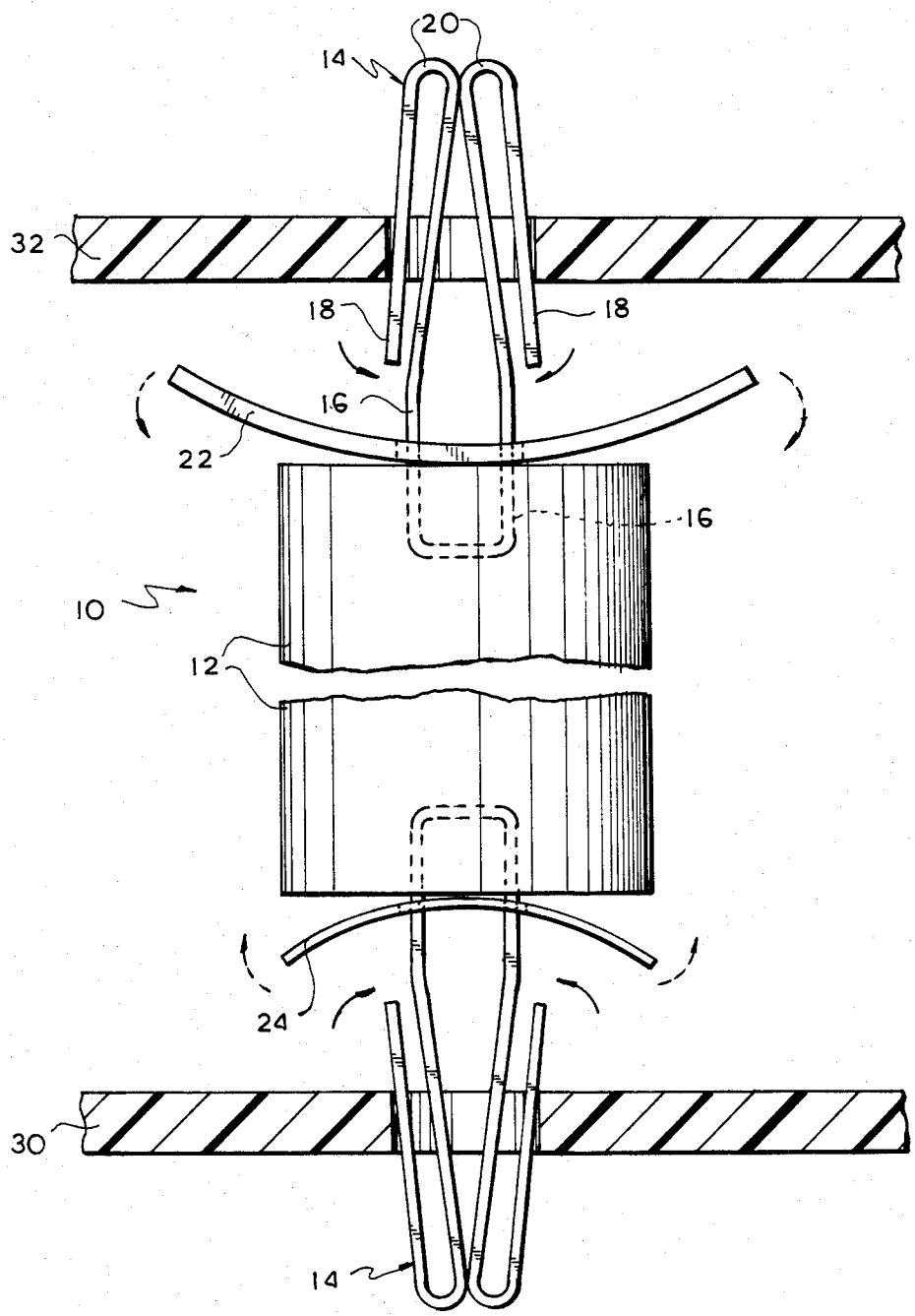
FIG. 2 is a fragmentary front elevation view of the standoff as it is being attached to the structure indicated partially in cross-section.

Referring now to FIG. 2 in particular, therein illustrated is the standoff of FIG. 1 in the process of being secured at the bottom to a printed circuit board 30 and at the top to a chassis 32. While FIG. 2 shows the standoff being secured both to the printed circuit board 30 and chassis 32 simultaneously, generally the standoff will first be attached to one and then the other, typically the chassis first. As the locking member 14 is being inserted into the suitably provided aperture of a structure 30, 32, the snap-in portions 18 flex inwardly as indicated by the solid arrows. When the periphery of the spring member 22, 24 is contacted by the structure 30, 32 the spring member bows outwardly (and toward the proximate face of the plastic body) as indicated by the dotted arrows.

Figure 3:
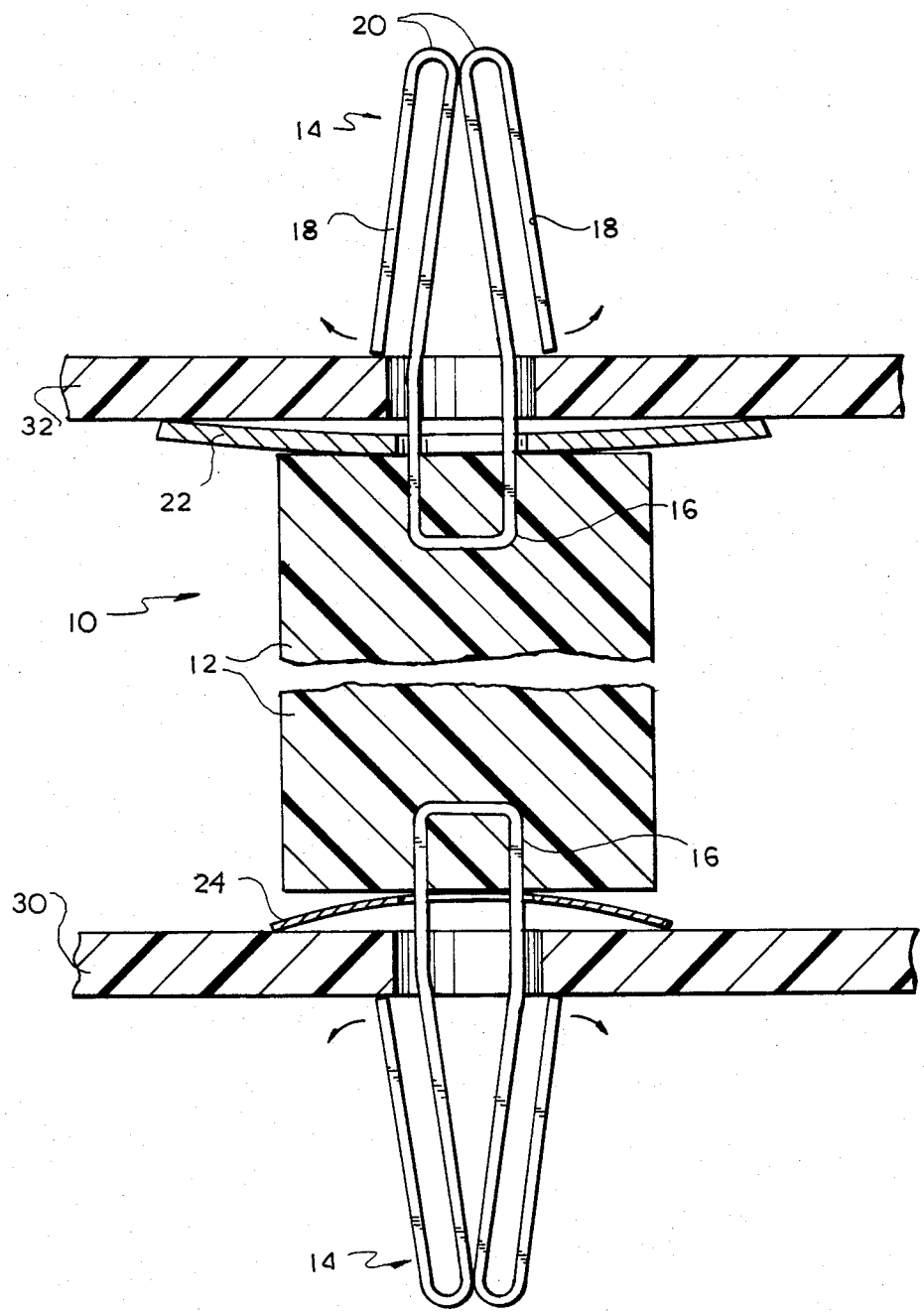
FIG. 3 is a fragmentary front elevation cross-sectional view similar to FIG. 2 except that the standoff is fully attached to the structure.

Referring now to FIG. 3, in the final assembly therein illustrated the snap-in portions 18 have already passed through the apertures of the structures 30, 32, snapped outwardly in the direction of the solid arrows, and now extend beyond the apertures. The structures 30, 32 are firmly grasped between the tips of the snap-in portions 18 and the peripheries of the spring members 24, 22. The mounting accommodates chassis and circuit boards of various thicknesses as the spring members 22, 24 press the structures 32, 30 against the free tips of the snap-in portions 18. The structures are easily removable from the final assembly for repair or replacement by squeezing the snap-in portions 18 inwardly and forcing the standoff out of the structures.

Figure 4:
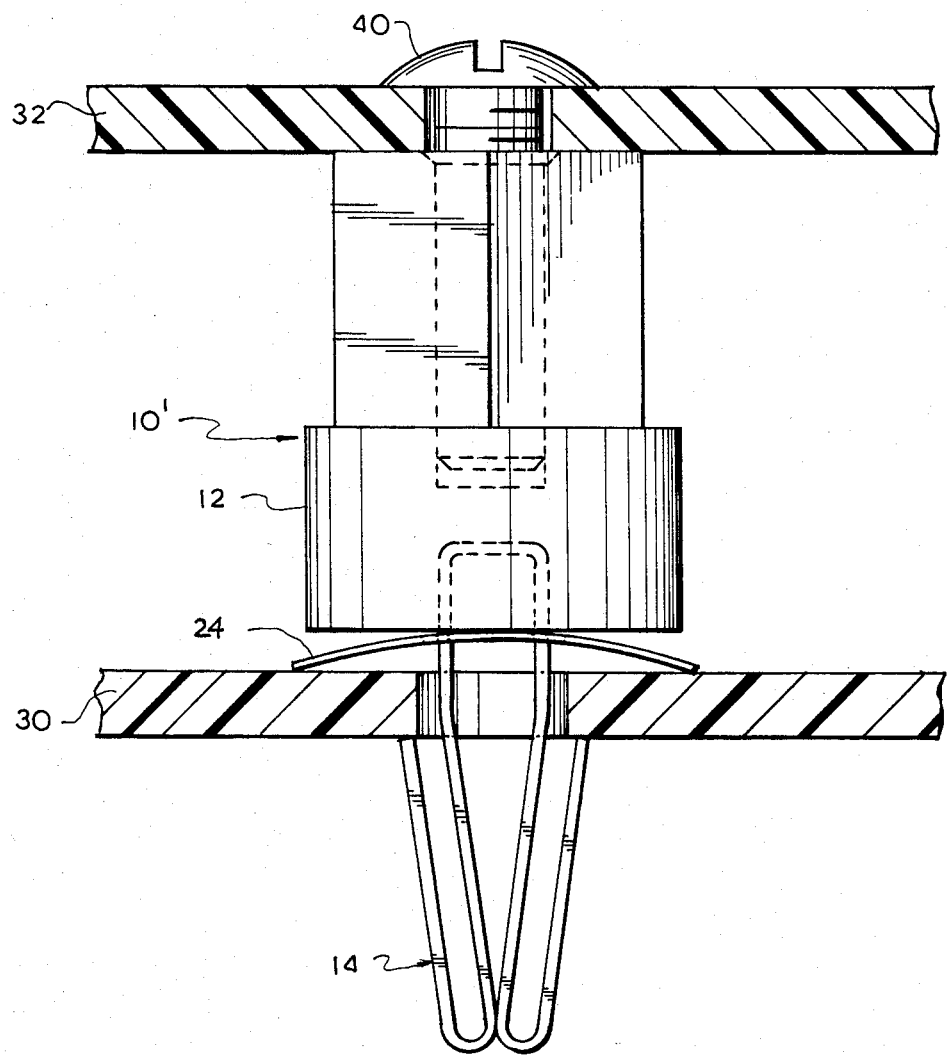
FIG. 4 is a front elevation view of a second embodiment of the standoff attached to the structure indicated partially in cross-section.

Referring now to FIG. 4, therein illustrated is a second preferred embodiment 10' of the standoff. In this embodiment, one face of the plastic body 12 (the bottom end as shown in FIG. 4) is provided with a locking member 14 as described hereinabove, while the opposite face (the top end as shown in FIG. 4) is provided with a recess adapted to receive a screw 40. In this embodiment there is no flexible spring member 22 as the prime function of the spring members is to take up the play between a face of the plastic body and the free ends of the snap-in portions 18 (thereby permitting the standoff to achieve a tight assembly even with structures of varying thicknesses) and in the second embodiment the screw 40 can simply be tightened to the degree required to eliminate play.

It will be appreciated that the present invention encompasses standoffs having the plastic body 12 with a snap-in locking member 14 at one end thereof, and at the other end any configuration adapted to suit the intended application. In one adaptation of the second embodiment, the recess in the other end is internally threaded and so adapted to receive a regular screw; in another adaptation of the second embodiment the recess in the other end is unthreaded and so adapted to receive a self-tapping screw.

Figure 5:
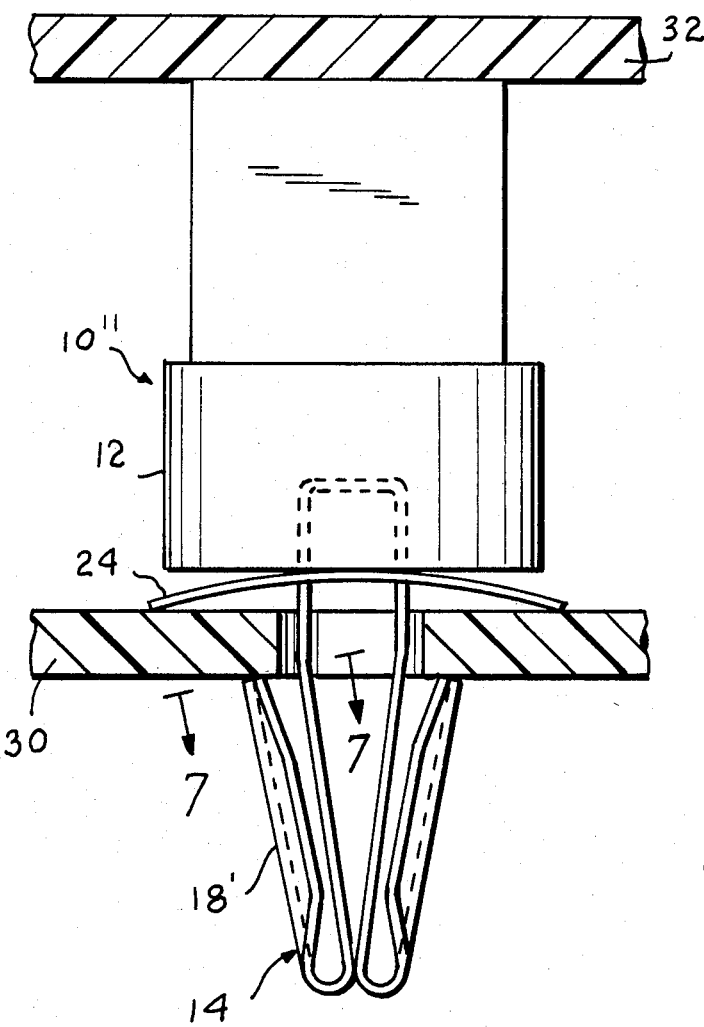
FIG. 5 is a front elevation view of a third embodiment of the standoff in an assembly.
Figure 6:
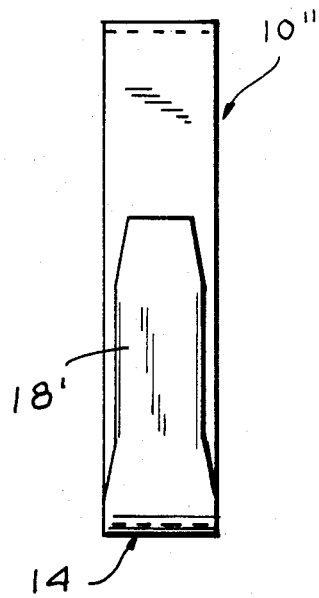
FIG. 6 is a side elevation view of the snap-in portion of the third embodiment.
Figure 7:
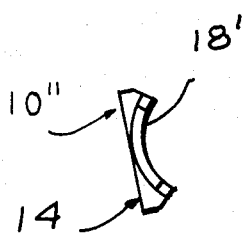
FIG. 7 is an elevation view of the snap-in portion taken along the line 7—7 of FIG. 5.

Referring now to FIGS. 5–7, in a third embodiment 10″ the other end is simply a flat solid so as to present an abutment surface enabling the engaged structure 30 to be spaced from the abutting structure 32. If desired, the solid other end may be curved or rounded. The third embodiment is useful, for example, in situations where a printed circuit board (secured to the locking member end of the standoff) is simply to rest on or be spaced from an imperforate chassis structure.

In the third embodiment the locking member 14 at the operative end defines snap-in portions 18′ which are curved about the longitudinal axis in order to provide additional columnar strength.

While the preferred configurations of the locking member 14 have been illustrated in the drawings, clearly locking members of other configurations will also find utility in the present invention.

Where board 30 is possessed of sufficient resiliency, the locking member 14 may be rigid and non-resilient with the board 30 providing the resiliency necessary to enable insertion of the locking member snap-in portions therethrough.

While the structure of the present invention has been described in terms of a "standoff", identical structures find utility in the mechanical arts where they are more commonly referred to as "spacers".

It will be appreciated that in each embodiment the retaining member illustrated is also a locking member because it provides a positive non-camming attachment of the structure to the standoff and requires an additional operation (beyond the simple pushing apart of the structure and the standoff) in order to depress the locking portions and enable separation of the structure from the standoff. It is furthermore a locking member of the snap-in type as the snap-in portion or holding portion is deformed during the assembly process and thereafter abruptly returns to its original position due to the resiliency of the reverse bend position.

To summarize, the standoff of the present invention combines the strength and security characteristic of a metal locking member with the inexpensiveness characteristic of a plastic body and the ease of assembly characteristic of a plastic push-in member. Where plastic is employed in the standoff, it is of relatively solid mass so that there is little tendency for the plastic to break and creep of the plastic is of no importance.

Now that the preferred embodiments of the present invention have been shown and described in detail, various modifications and improvements thereon will become readily apparent to those skilled in the art. Accordingly, the spirit and scope of the present invention is to be limited only by the appended claims, and not by the foregoing disclosure.

We claim:

1. A combined metal and plastic standoff for supporting a circuit board in fixed spatial relationship with another element, comprising a rigid plastic body of appreciable length to produce the standoff effect, and a metal retaining member integrally mounted on said plastic body at an operative end thereof and having main, reverse bend and retaining portions, said main portion being in part fixedly disposed within said plastic body, said reverse bend portion being resilient and connecting said main and retaining portions, and said retaining portion being disposed outwardly of and longitudinally beyond said plastic body and comprising means for engagement with the circuit board or other element by an essentially longitudinal motion of the standoff along the axis of said body length to physically lock the circuit board or other element to said plastic body adjacent said operative end.

2. The standoff of claim 1 wherein said plastic body has two operative ends and a metal retaining member integrally mounted on said plastic body at each of said operative ends, said metal retaining member at one of said operative ends comprising means to physically lock the circuit board to said plastic body adjacent said one operative end and said metal retaining member at the other of said operative ends comprising means to physically lock the other element to said plastic body adjacent said other operative end.

3. The standoff of claim 1 wherein the other end of said plastic body defines a recess.

4. The standoff of claim 3 wherein said recess is internally threaded.

5. The standoff of claim 1 wherein the other end of said plastic body is solid.

6. The standoff of claim 1 further comprising a spring member mounted at said operative end and configured and dimensioned to hold the circuit board or other element against said retaining member.

7. The standoff of claim 1 wherein said plastic body is formed of an electrically insulative plastic.

8. The standoff of claim 1 wherein said plastic body is formed of an electrically conductive plastic.

9. The standoff of claim 1 wherein said metal retaining member is resilient and is formed in one piece.

10. The standoff of claim 1 wherein said retaining member comprises a pair of said retaining portions, each of said retaining portions being connected to a different end of said main portion by a different reverse bend portion.

11. The standoff of claim 10 further comprising a spring member mounted at said operative end and configured and dimensioned to hold the circuit board or other element against said retaining portions.

12. The standoff of claim 1 wherein said retaining portion snaps in by a movement having a component perpendicular to the axis of said body length.

* * * * *